(12) United States Patent
Deak et al.

(10) Patent No.: US 12,072,226 B2
(45) Date of Patent: Aug. 27, 2024

(54) DIGITAL LIQUID LEVEL SENSOR UTILIZING CROSS-POINT MAGNETORESISTIVE SENSOR ARRAY

(71) Applicant: MultiDimension Technology Co., Ltd., Zhangjiagang (CN)

(72) Inventors: James Geza Deak, Zhangjiagang (CN); Elamparithi Visvanathan, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 386 days.

(21) Appl. No.: 17/310,912

(22) PCT Filed: Feb. 26, 2020

(86) PCT No.: PCT/CN2020/076803
§ 371 (c)(1),
(2) Date: Aug. 30, 2021

(87) PCT Pub. No.: WO2020/177595
PCT Pub. Date: Sep. 10, 2020

(65) Prior Publication Data
US 2022/0120601 A1     Apr. 21, 2022

(30) Foreign Application Priority Data
Mar. 4, 2019   (CN) .......................... 201910160547.0

(51) Int. Cl.
*G01F 23/72*     (2006.01)
*G01F 23/68*     (2006.01)
*G01R 33/09*     (2006.01)

(52) U.S. Cl.
CPC .............. *G01F 23/72* (2013.01); *G01F 23/68* (2013.01); *G01R 33/098* (2013.01)

(58) Field of Classification Search
CPC ....... G01F 23/72; G01F 23/68; G01R 33/098; G11C 11/16; G11C 11/1673; B82Y 10/00;
(Continued)

(56) References Cited

U.S. PATENT DOCUMENTS 4,589,282 A     5/1986  Dumery
2011/0000297 A1*  1/2011  Ford ........................ G01F 23/36
                                                         73/317
(Continued)

FOREIGN PATENT DOCUMENTS

CA         2179457 A1     12/1997
CN         103968918       8/2014
(Continued)

OTHER PUBLICATIONS

"International Application No. PCT/CN2020/076803, International Search Report and Written Opinion dated May 12, 2020", (May 12, 2020), 9 pgs.

*Primary Examiner* — Brandi N Hopkins
(74) *Attorney, Agent, or Firm* — Schwegman Lundberg & Woessner, P.A.

(57) ABSTRACT

A digital liquid level sensor based on a magnetoresistive sensor cross-point array includes tunnel magnetoresistance (TMR) magnetic sensor chips; a microcontroller electrically connected to a row decoder and a column decoder. The TMR magnetic sensor chips include magnetic tunnel junction (MTJ) elements. Diodes are connected between each row of MTJ elements and a row lead or a column lead. The TMR magnetic sensor chips are addressed using data decoded by the row decoder and the column decoder. The microcontroller is used for scanning addresses of the TMR magnetic sensor chips for the address of an MTJ element in the highest active state, converting the address value into a liquid level value in a linear proportional relationship therewith, and transmitting the liquid level value to an output interface. The (Continued)

power consumption of a sensor element is greatly minimized by powering only one sensor chip element each time.

11 Claims, 10 Drawing Sheets

(58) Field of Classification Search
CPC ....... H03M 1/1061; G01B 7/30; G01D 5/145; G01N 27/76
See application file for complete search history.

(56) References Cited

U.S. PATENT DOCUMENTS

2015/0355014 A1   12/2015  Deak et al.
2016/0123789 A1*  5/2016  Deak ........................ G01F 23/54
                                                        73/317

FOREIGN PATENT DOCUMENTS

| CN | 106662480 A * | 5/2017 | ............. G01F 23/72 |
| --- | --- | --- | --- |
| CN | 108195442 A | 6/2018 | |
| CN | 109708727 A | 5/2019 | |
| WO | WO-2014114259 | 7/2014 | |
| WO | WO-2015034656 A1 | 3/2015 | |
| WO | WO-2020177595 A1 | 9/2020 | |

\* cited by examiner

DIGITAL LIQUID LEVEL SENSOR UTILIZING CROSS-POINT MAGNETORESISTIVE SENSOR ARRAY

PRIORITY CLAIM TO RELATED APPLICATIONS

This application is a U.S. national stage filing under 35 U.S.C. § 371 from International Application No. PCT/CN2020/076803, filed on 26 Feb. 2020, and published as WO2020/177595 on 10 Sep. 2020, which claims the benefit under 35 U.S.C. 119 to Chinese Application No. 201910160547.0, filed on 4 Mar. 2019, the benefit of priority of each of which is claimed herein, and which applications and publication are hereby incorporated herein by reference in their entirety.

TECHNICAL FIELD

The present invention relates to a digital liquid level measuring system, and more particularly to a digital liquid level sensor based on a magnetoresistive sensor cross-point array.

BACKGROUND

It is well known in the prior art that a liquid level sensor uses a magnetic field sensor. Most common sensors (e.g., a reed switch) are arranged in a linear array in a tube immersed in a liquid, and a permanent magnet is attached to a float, so that when the height of the liquid surface changes, the float moves along the outside of the tube, and then an electronic device that is used to determine which switches are closed by the permanent magnet is used to determine the liquid level.

In the patent application with patent No. WO 2015/034656, a typical example "Resistive Level/Temperature Sensor and Transmitter" is shown, in which an array of reed switches is attached to a series resistor array such that when a reed switch is activated by a permanent magnet, it connects a part of the resistor array to the ground to change the resistance of the array in a manner linearly proportional to the level of the liquid being measured. Therefore, the resistor array provides a method of simply measuring a liquid level. This classic design has a low resolution due to the large size of the reed switches, is prone to damage due to the glass package and mechanical properties of the reed switches, and is expensive to assemble. In addition, since the readout is impedance, it is sensitive to noise and temperature, and a thermometer is required for calibration.

In order to overcome the disadvantages of impedance design, other liquid level sensors are designed to detect the digital state of the reed switches, including open and closed. This design is difficult to address the problem of a large number of reed switches. One common solution is to use a cross-point array structure, where each reed switch is located at a cross point of row leads and column leads in the lead array. Since the reed switches have infinite resistance values in the open state and very small resistance values in the closed state, it is possible to detect which switches are closed in the array by scanning all possible row leads and column leads. A typical example is Canadian patent No. CA2,179,457 entitled "Method and Device for Measuring Liquid Level Using Liquid Level Indicator Having Reed Switch for Determining Position of Magnetic Float." The disadvantage of this design is that reed switches are fragile and expensive to assemble, and their resolution is limited by their relatively large size. Additionally due leakage current in the cross-point array causes error, such that it cannot be used for a sensor which does not have infinite resistance in the open state, two-port sensor with resistance variations are especially troublesome. Typical three-port magnetic switches other than the reed switches provide voltage outputs rather than variations in the resistance value.

Since the reed switches are fragile and result in expensive manufacturing cost, it is usually desirable to use a magnetoresistive sensor or a Hall sensor to detect the position of a magnetic float in the liquid level sensor. A magnetoresistive switch sensor is usually used as an alternative to a reed switch to complete the measurement. The output of the switch sensor is usually digital voltages that are applied in a linear resistor array liquid level sensor complex, but are very useful for the digital architecture. A digital liquid level sensor design using a magnetoresistive switch is disclosed in the patent application No. WO 2014/114259 entitled "Digital Liquid Level Sensor." In this design, the digital output of a level sensor is connected to an encoder such that a numeric value of the encoder represents the position of the highest activated magnetoresistive switch. This is a simple robust design, but is affected by high power consumption because all digital switches need to be powered simultaneously. In order to solve this problem, small passive two-port magnetic tunnel junction (MTJ) elements arranged in a cross-point array can be utilized to develop a liquid level sensor.

SUMMARY

In order to overcome the above problems in the prior art, the present invention proposes a digital liquid level sensor based on a magnetoresistive sensor cross-point array, to reduce the average power consumption of sensor elements and further simplify the requirement for processing digital circuits outputted by each sensor. Adding diodes in series with MTJ elements allows arranging multiple small passive MTJ element strings in a cross-point array architecture. In addition, because of the use of the passive sensor elements, small bare sensor dice may be used and arranged in the liquid level sensor using a chip on board (COB) technology or other small chip scale package (CSP). In addition, arranging a plurality of sensor elements onto a single chip may increase the sensor measurement resolution.

The embodiments of the present invention provide a digital liquid level sensor based on a magnetoresistive sensor cross-point array, including: a printed circuit board (PCB) (also referred to herein as PCB board), a plurality of tunnel magnetoresistance (TMR) magnetic sensor chips provided on the PCB board, and M row leads and N column leads provided on the PCB board, wherein M and N are integers greater than or equal to 1;

a microcontroller, a row decoder, and a column decoder provided on the PCB board, wherein the microcontroller is electrically connected to the row decoder and the column decoder, the column decoder is connected to the TMR magnetic chips through the column leads, the row decoder is connected to the TMR magnetic sensor chips through the row leads, each of the TMR magnetic sensor chips includes a plurality of MTJ elements, the MTJ elements are electrically connected into an MTJ element array of M rows and N columns, diodes are connected between each row of MTJ elements and a row lead or a column lead, and the TMR magnetic sensor chips are addressed by means of data decoded by the row decoder and the column decoder and on the basis of an equation Address=m+[M×(n−1)], in which Address represents an address value, m represents a value of a current row with a range of 1≤m≤M, and n represents a value of a current column with a range of 1≤n≤N;

the microcontroller is used for scanning addresses of the TMR magnetic sensor chips for the address of an MTJ element in the highest active state, converting the address value to a liquid level value in a linear proportional relationship therewith, and transmitting the liquid level value to an output interface;

a permanent magnet attached to a magnetic float that moves along a long axis direction of the PCB board and changes a magnetic field state of an MTJ element near the permanent magnet, the magnetic float floating with the surface of a liquid in which the liquid level sensor is immersed; and a protective tube enclosing the PCB board.

Further, one end of each row of MTJ elements on each of the TMR magnetic sensor chips is electrically connected to one or more column lead pads connected to a column lead, and the other end of each row of MTJ elements is electrically connected to a row lead pad.

Further, each row of MTJ elements includes an MTJ element or an MTJ element string containing at least two MTJ elements connected in series.

Further, the PCB board is a flexible PCB board.

Further, the TMR sensor chips are connected to the PCB board by means of lead bonding or chip flip and have a linear or bipolar response.

Further, the diodes are integrated on the TMR magnetic sensor chips and connected in series between each row of MTJ elements and the row lead pad provided in the row.

Further, the diodes are integrated on the TMR magnetic sensor chips and connected in series between each row of MTJ elements and the column lead pad electrically connected thereto.

Further, the digital liquid level sensor further includes a row selection MOSFET, a column selection MOSFET, and a comparison circuit, wherein the drain of the row selection MOSFET is electrically connected to a row lead, the gate of the row selection MOSFET is connected to an output end of the row decoder, and the source of the row selection MOSFET is connected in series to one end of first resistor R1 and a first input end of the comparison circuit, and an electrical node between the row selection MOSFET and first resistor R1 is output as output voltage $V_{out}$, and the other end of first resistor R1 is connected to power voltage VCC; the column decoder is electrically connected to the gate of the column selection MOSFET; two second resistors R2 are connected in series between the power voltage VCC and the ground, an intermediate point of the two second resistors R2 outputs reference voltage $V_{ref}$ and is connected to a second input end of the comparison circuit, the output end of the comparison circuit is electrically connected to the microcontroller, the comparison circuit outputs a high level signal value when output voltage $V_{out}$ is smaller than reference voltage $V_{ref}$, and outputs a low level signal value when output voltage $V_{out}$ is greater than or equal to reference voltage $V_{ref}$, wherein the output level signal values represent active values of the MTJ elements in the TMR sensor chips being addressed.

Further, the digital liquid level sensor further includes a zero liquid level setting device which sets the liquid level to a zero fill level state when there is no MTJ element being activated and the magnetic float passes through the sensor at the bottommost position.

Further, a magnetic field generated by the permanent magnet activates the MTJ elements at a distance greater than an interval between two MTJ elements but less than an interval between three MTJ elements, and a fill level value is calculated by inserting a permanent magnet between two MTJ elements.

Further, the TMR sensor chips select a magnetoresistive sensor chip having two ports.

Further, the TMR sensor chips are packaged with CSP.

The digital liquid level sensor based on a magnetoresistive sensor cross-point array according to the embodiments of the present invention greatly minimizes the power consumption of sensor elements by utilizing a small number of components and by powering only one sensor chip element each time. The digital liquid level sensor of the present invention completes the digital measurement of the liquid level in a reliable, rapid, and cost-effective manner.

DESCRIPTION OF THE DRAWINGS

In order to more clearly illustrate the embodiments of the present invention or the technical solutions in the prior art, the accompanying drawings that need to be used in the embodiments or in the description of the prior art will be briefly introduced below. It is obvious that the accompanying drawings in the description below are only some embodiments of the present invention, and for a person of ordinary skill in the art, other accompanying drawings can also be obtained according to these accompanying drawings without any inventive effort.

DETAILED DESCRIPTION

In order to make the objects, the technical solutions, and the advantages of the present invention clearer, below will describe the technical solutions in the embodiments of the present invention clearly and completely in conjunction with the accompanying drawings in the embodiments of the present invention. It is obvious that the described embodiments are some, rather than all, of the embodiments of the present invention. It will also be noted that in order to facilitate the description, only the parts related to the present invention are shown in the drawings rather than all of the structure.

Figure 1:
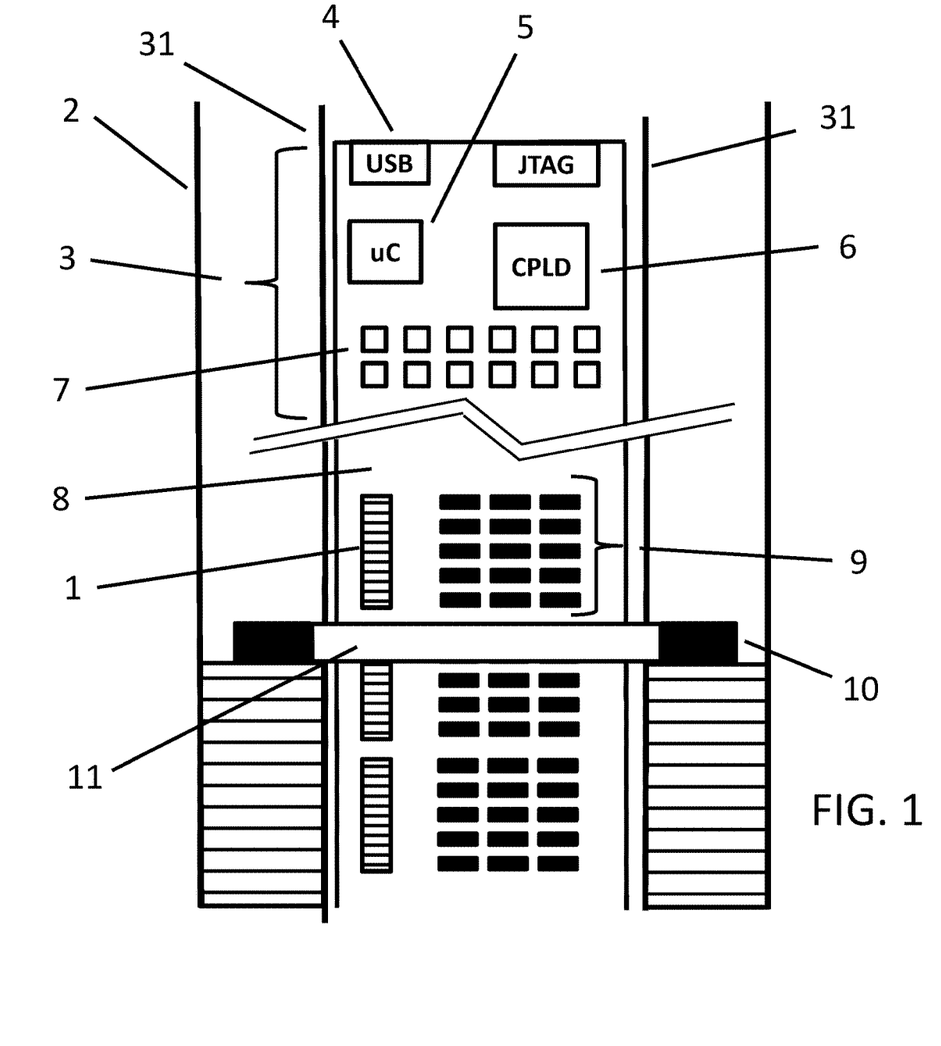
FIG. 1 is a partial cross-sectional schematic diagram of a digital liquid level sensor based on a magnetoresistive sensor cross-point array according to an embodiment of the present invention.
Figure 2:
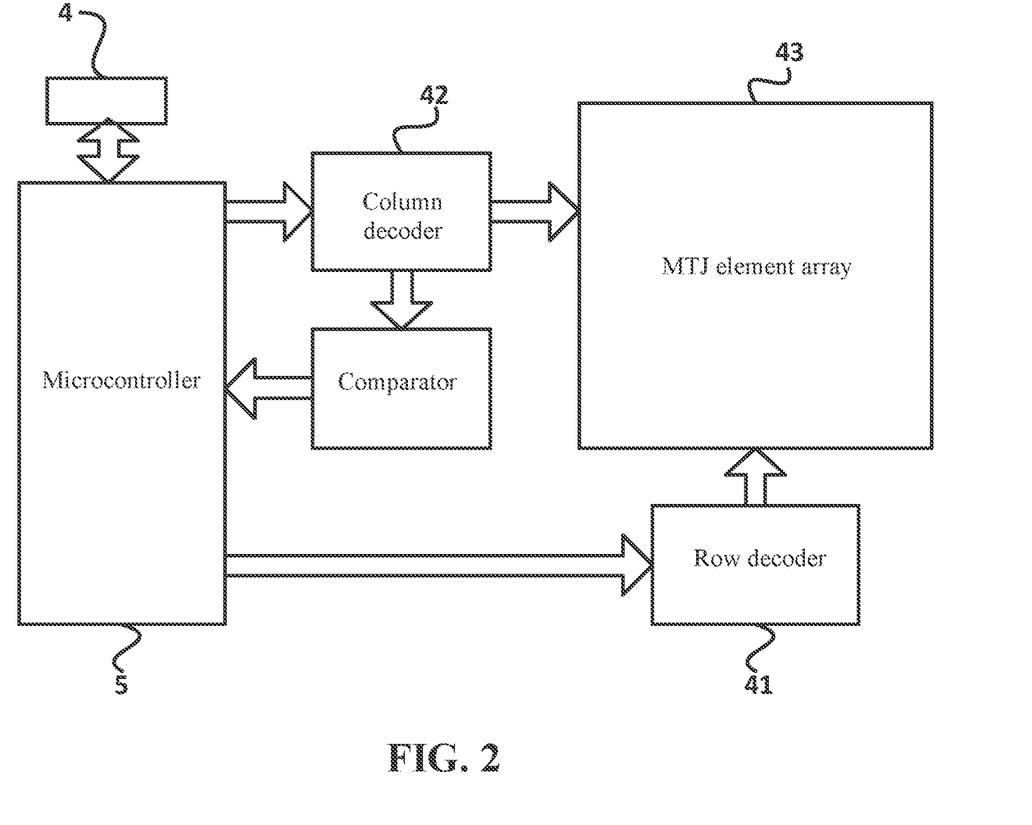
FIG. 2 is a structure diagram of a digital liquid level sensor based on a magnetoresistive sensor cross-point array according to an embodiment of the present invention.

FIG. 1 is a partial cross-sectional schematic diagram of a digital liquid level sensor based on a magnetoresistive sensor cross-point array according to an embodiment of the present invention. FIG. 2 is a structure diagram of a digital liquid level sensor based on a magnetoresistive sensor cross-point array according to an embodiment of the present invention. Referring to FIG. 1 and FIG. 2, the digital liquid level sensor based on a magnetoresistive sensor cross-point array includes: PCB board 8, a plurality of TMR magnetic sensor chips 1 provided on the PCB board 8, and M row leads (not shown in the figures) and N column leads (not shown in the figures) provided on the PCB board 8, wherein M and N are integers greater than or equal to 1;

microcontroller 5 provided on PCB board 8, the microcontroller 5 being used for scanning the addresses of TMR magnetic sensor chips 1 for the address of an MTJ element in the highest active state, converting the address value to a liquid level value in a linear proportional relationship therewith, and transmitting the liquid level value to output interface 4, wherein the MTJ element in the highest active state may be an MTJ element that is closest to the liquid level height among the activated MTJ elements. Row decoder 41 and column decoder 42 may be included in digital logic circuit 3. Output interface 4 of the digital sensor may be an I/O interface in the form of an IC chip or interface board.

Referring to FIG. 1, PCB board 8 may alternatively be a strip, which makes it convenient to make a liquid level sensor into a strip and facilitates the detection of the liquid level by the liquid level sensor, thus enhancing user experience.

Referring to FIG. 1, the liquid level sensor further includes switching circuit 7. TMR magnetic sensor chips 1 are provided on strip PCB board 8, wherein microcontroller 5 scans addresses of TMR magnetic sensor chips 1 (specifically addresses of a plurality of MTJ elements included in each of TMR magnetic sensor chips 1) for the address of an MTJ element in the highest active state, and records the state of each MTJ element in each TMR magnetic sensor chip simultaneously with output interface 4 (e.g., the I/O interface described above), including the active state and the inactive state, and as described above, the MTJ element in the highest active state may be an MTJ element that is closest to the liquid level height among the activated MTJ elements.

PCB board 8 is a flexible PCB board. The strip PCB board 8 is arranged in protective tube 31. Meanwhile, permanent magnet 10 is attached to magnetic float 11, and magnetic float 11 floats with the surface of the liquid in which the liquid level sensor is immersed; and permanent magnet 10 and magnetic float 11 are also arranged outside of protective tube 31. Permanent magnet 10 moves along the long axis direction of PCB board 8 and changes the magnetic field state of a TMR magnetic sensor chip near the permanent magnet, and the permanent magnet also floats up and down relative to the surface of the liquid.

The spacing distance of the MTJ elements in TMR magnetoresistive sensor chips 1 along the long axis direction of the strip PCB board and the size of TMR magnetoresistive sensor chips 1 and the size of the floating permanent magnet 10 determine the accuracy of liquid level measurement. Microcontroller 5 and other digital logic circuits having an I/O interface are provided at the top of the strip PCB board. These digital logic circuits, such as a row decoder and a column decoder, may be programmed on Complex Programmable Logic Device (CPLD) IC 6 shown in FIG. 1 to select row leads and column leads of the MTJ elements.

Microcontroller 5 provides an address input to the leads selected by the row decoder and the column decoder, and the output of the row decoder and the column decoder is used to drive a specific MTJ element to activate the specific MTJ element. The state of the activated TMR magnetic sensor chip will be recorded by microcontroller 5, and the activated MTJ element is recorded by microcontroller 5.

Figure 3:
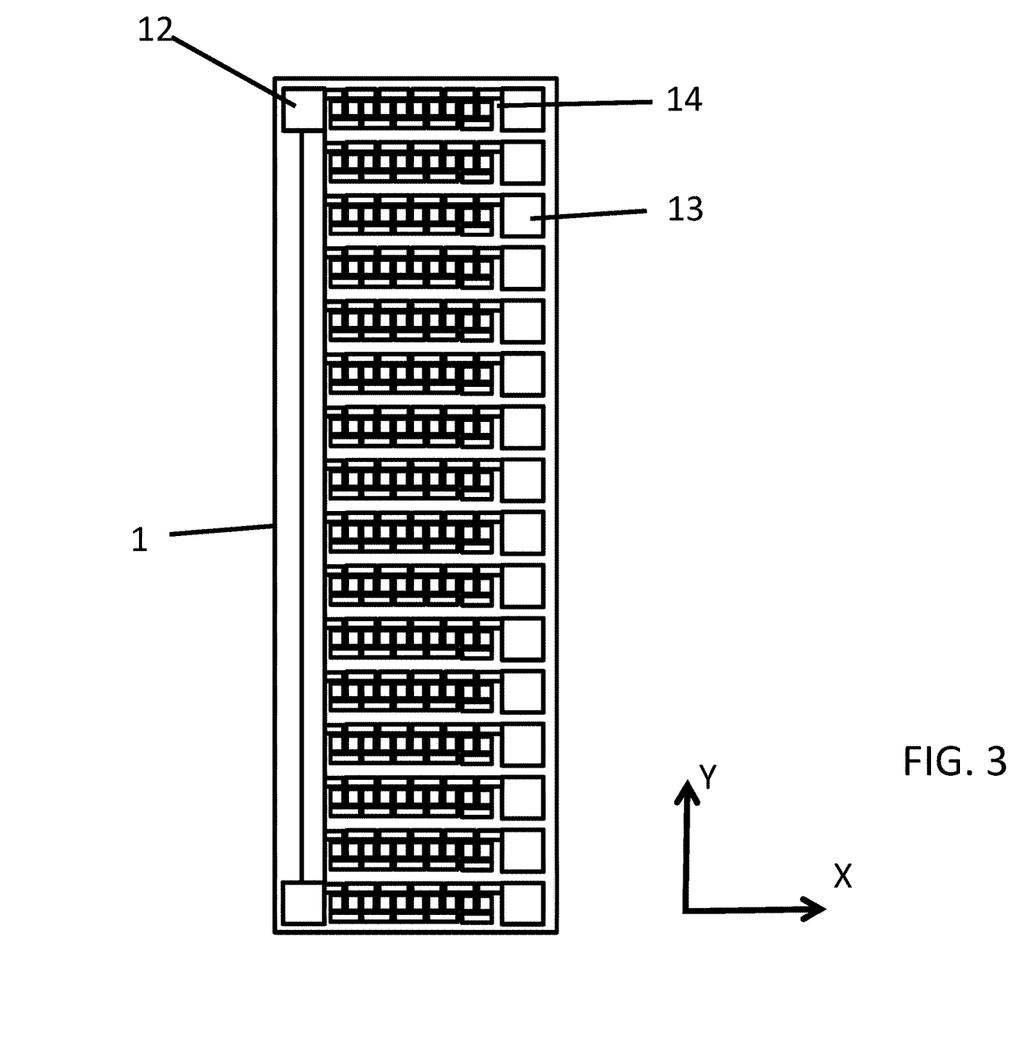
FIG. 3 is a schematic diagram of an on-board chip layout of TMR magnetic sensor chips for arranging several MTJ elements.

FIG. 3 is a schematic diagram of the on-board chip layout of TMR magnetic sensor chips for arranging several MTJ elements; as shown in FIG. 3, an on-board chip pad may accommodate 16 TMR magnetoresistive sensor chips, which may be used in a design that includes 16*16 MTJ elements. The packaging pad has column lead pad 12 to connect one end of all 16 MTJ elements universally, and has separate row lead pad 13 to connect the other end of each of the 16 MTJ elements. Each row lead may also include several soldering pads 14, and these soldering pads 14 are used to connect the MTJ element string in series in each row by means of lead bonding to form a single row of MTJ element strings.

Figure 4:
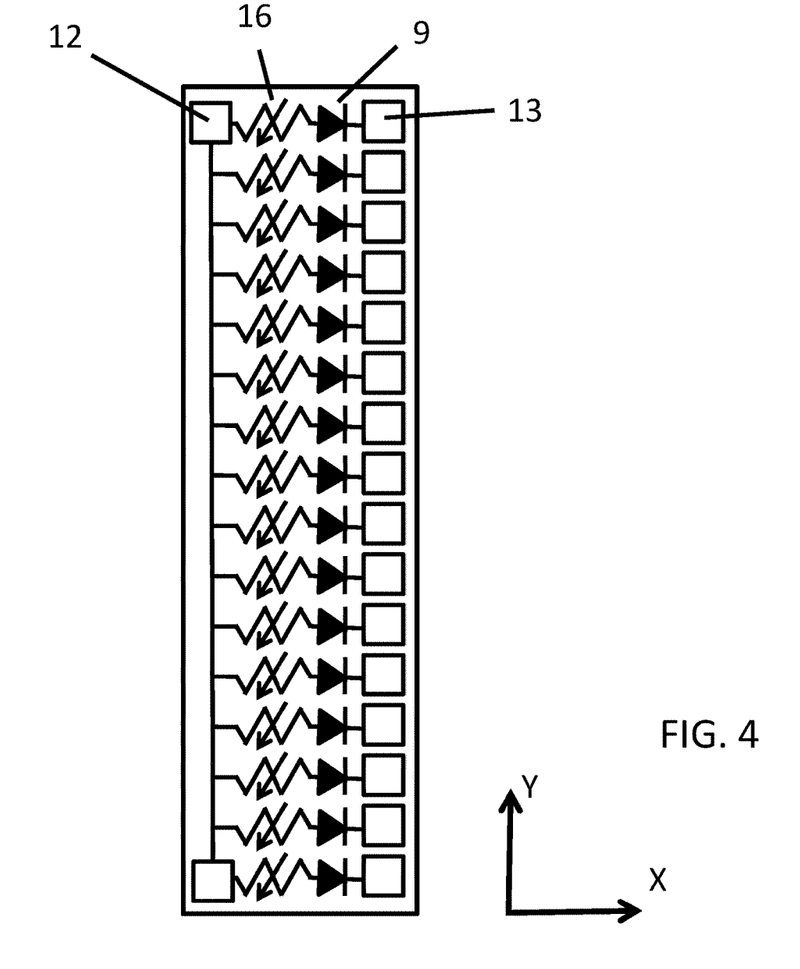
FIG. 4 is a schematic diagram of a connection structure of TMR magnetic sensor chips with row pads and column pads according to an embodiment of the present invention.

FIG. 4 is a schematic diagram of a connection structure of TMR magnetic sensor chips with row pads and column pads according to an embodiment of the present invention, and the structure of corresponding diode 9 is in the form of an on-chip diode; one end of each row of MTJ elements 16 on each of the TMR magnetic sensor chips is electrically connected to one or more column lead pads 12, the one or more column lead pads 12 being connected to a column lead, and the other end of each row of MTJ elements is electrically connected to row lead pad 13.

The PCB board of the present invention uses the Chips on Board (COB) or Chip Scale Package (CSP) technology. The present invention takes the COB technology as an example, in which the COB pad used by the TMR sensor chips has a column lead pad and a plurality of row lead pads connected to the column lead pad. The number of COB pads corresponds to the number of column elements. The MTJ elements are provided on TMR magnetic sensor chips 1, and the pads are to accommodate a plurality of MTJ elements. The pads used in the TMR magnetic sensor chips have a column lead pad and M row lead pads for designing an M*N array of MTJ elements. The plurality of TMR magnetic sensor chips are linearly arranged along the long axis direction of the PCB board, and the plurality of MTJ elements included therein are connected in a cross-point structure. The number of TMR magnetic sensor chips corresponds to the number of columns of MTJ elements.

Referring to FIG. 4, FIG. 4 illustrates each row of MTJ elements containing one MTJ element. Diodes 9 are integrated on the TMR magnetic sensor chips and connected in series between each row of MTJ elements and row lead pads 13 provided in the row. Row lead pads 13 are connected to diodes 9, where diodes 9 serve as a barrier to keep the current from flowing into an unselected MTJ element.

Figure 5:
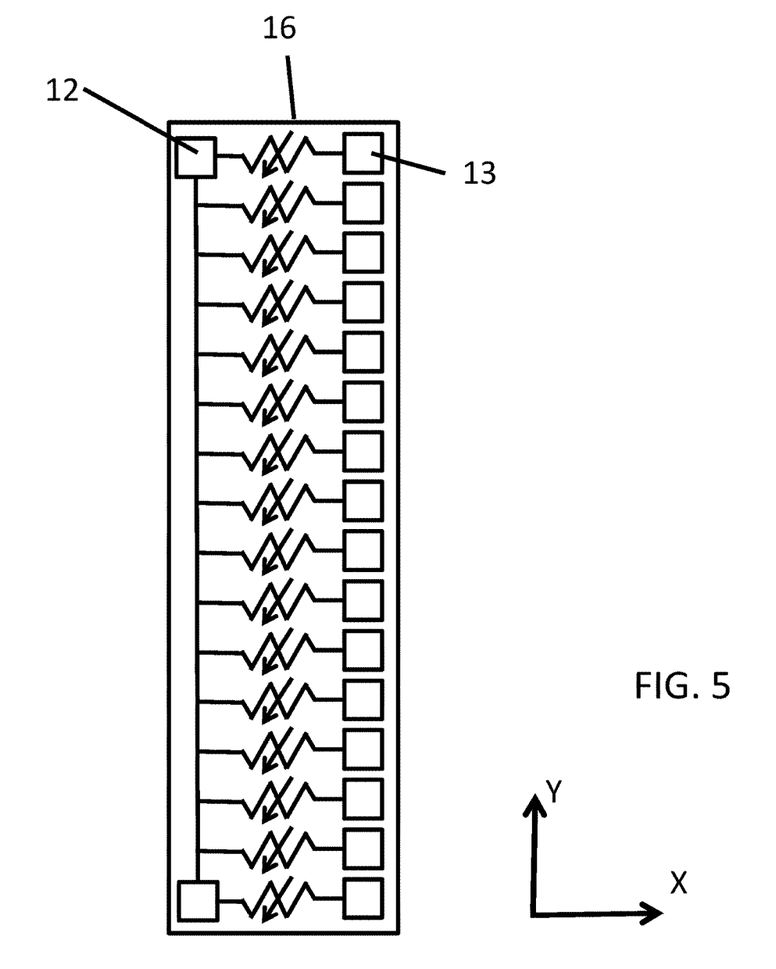
FIG. 5 is a schematic diagram of another connection structure of TMR magnetic sensor chips with row pads and column pads according to an embodiment of the present invention.

FIG. 5 is a schematic diagram of another connection structure of TMR magnetic sensor chips with row pads and column pads according to an embodiment of the present invention; and the structure of corresponding diode 9 is in the form of an off-chip diode.

Figure 6:
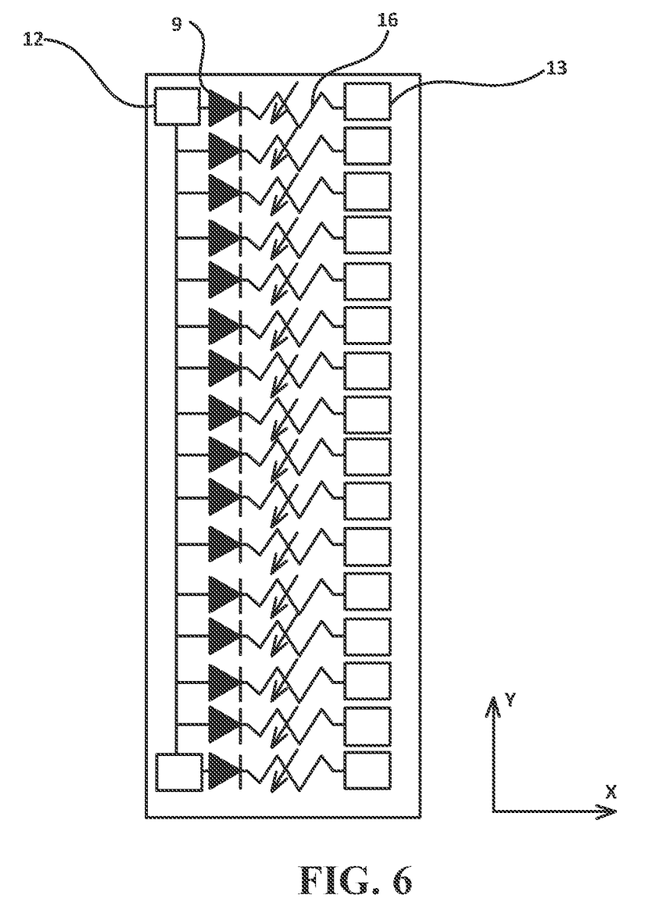
FIG. 6 is a schematic diagram of another connection structure of TMR magnetic sensor chips with row pads and column pads according to an embodiment of the present invention.

FIG. 6 is a schematic diagram of another connection structure of TMR magnetic sensor chips with row pads and column pads according to an embodiment of the present invention. Referring to FIG. 6, alternatively, diodes 9 are integrated on the TMR magnetic sensor chips and connected in series between each row of MTJ elements and column lead pads 12 electrically connected therewith.

Alternatively, each row of MTJ elements includes an MTJ element or an MTJ element string containing at least two MTJ elements connected in series.

Alternatively, the TMR sensor chips are connected to the PCB board by means of lead bonding or chip flip, and have a linear or bipolar response.

Figure 7:
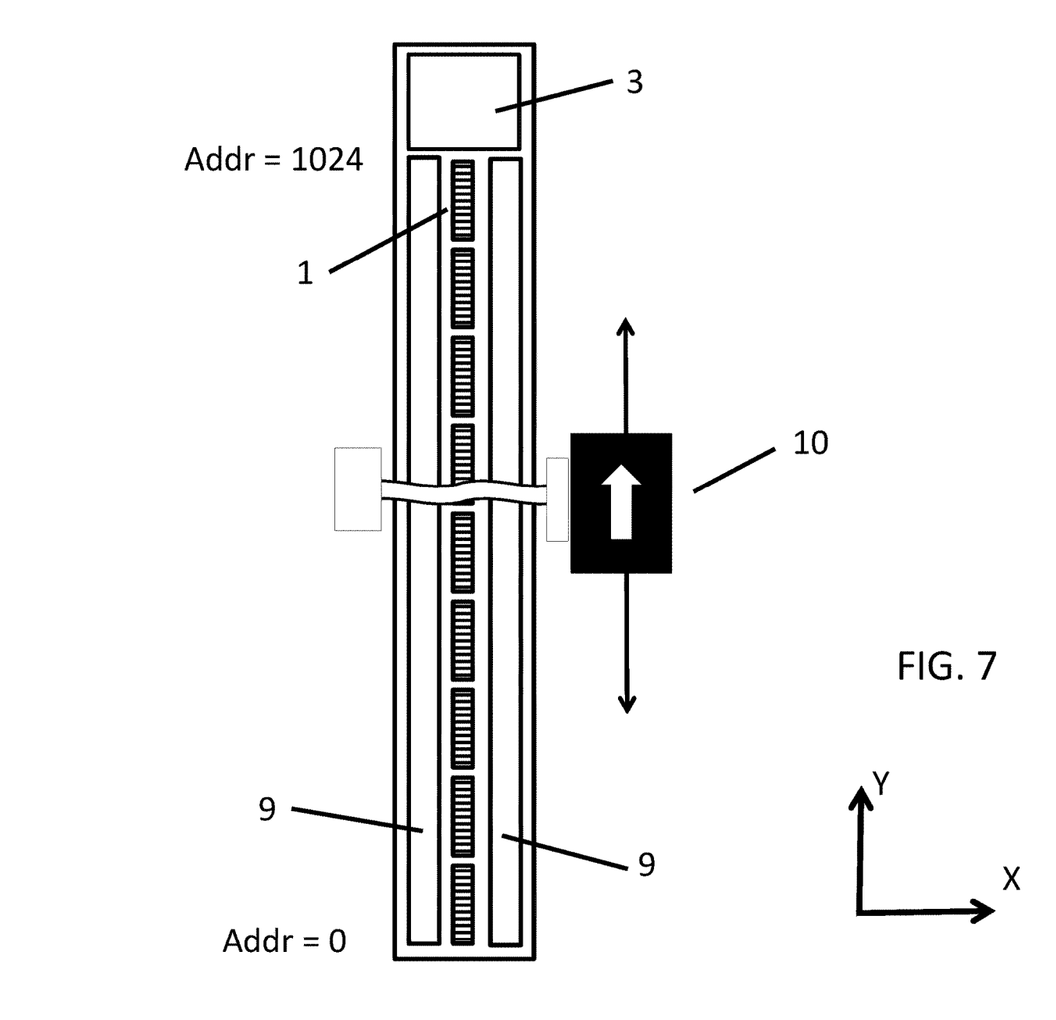
FIG. 7 is a schematic diagram of a PCB board layout according to an embodiment of the present invention.
Figure 8:
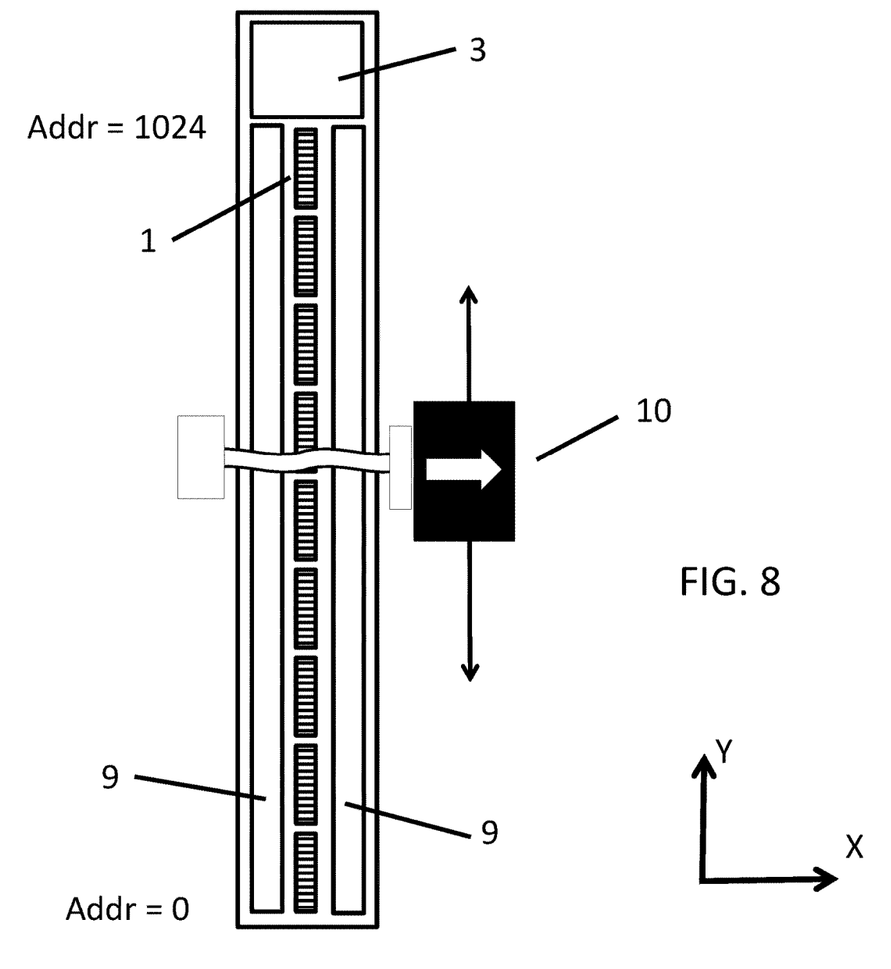
FIG. 8 is a schematic diagram of another PCB board layout according to an embodiment of the present invention.

FIG. 7 is a schematic diagram of a PCB board layout according to an embodiment of the present invention; FIG. 8 is a schematic diagram of another PCB board layout according to an embodiment of the present invention; and as shown in FIGS. 7 and 8, FIGS. 7 and 8 show a complete overview of a strip PCB board and a microcontroller unit and other digital logic circuits 3. Addressing starts from the MTJ elements of the bottommost TMR sensor chip to the MTJ elements of the topmost TMR sensor chip. In other words, the starting address of the bottommost sensor is zero, and the topmost sensor has the highest address bit. The strip PCB board may also use a TMR switch sensor element other than linear sensor elements. The magnetic orientation of floating permanent magnet 10 determines the switching properties of the MTJ elements in the TMR sensor used on the PCB board. As shown in FIG. 7, if the movement direction of permanent magnet 10 is parallel to a detection axis of a digital sensor (e.g., the movement direction of permanent magnet 10 in FIG. 7 is the Y-axis direction, the detection axis of the digital sensor is also the Y axis, and the two are parallel), a unipolar switch sensor may be used. If a magnetization axis of permanent magnet 10 is different from the detection axis of the digital sensor (corresponding to the case in FIG. 8, the magnetization axis of permanent magnet 10 is the X axis, the detection axis of the digital sensor is the Y axis, and the two are different), a bipolar switch sensor may be used. Preferably, the position of an MTJ element in a TMR sensor chip is the intermediate position of the PCB board along the X axis, and the lead bonding of the row lead pads, the column lead pads, and the diodes occupies both sides of the PCB board along the X axis.

Continuing with FIG. 2, the technical solution of the present invention includes different element blocks, such as pads for the row decoder and the column decoder of the TMR magnetic sensor chips, and microcontroller units for scanning and reading the states of TMR magnetic sensor chips. FIG. 2 illustrates a digital sensor containing 1024 MTJ elements, which may be represented as $2^{10}$ of 10 bytes. The row leads and the column leads are separated and share the same number of 25 bit lines. In this case, the row leads and the column leads are therefore 32*32, which may produce 1024 possible combinations. Each MTJ element is addressed using the row decoder and the column decoder. Changes in the states or values of the TMR magnetic sensor chips may be read on the row leads, and a comparator further compares the values with a reference value thereof, and provides a digital output read later by the microcontroller.

Figure 9:
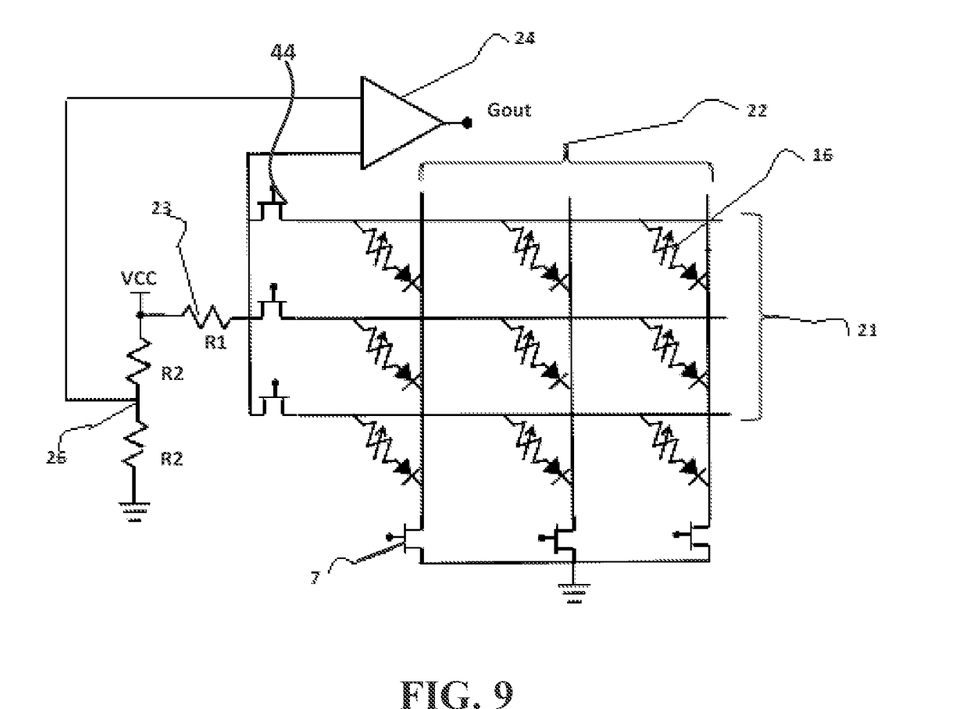
FIG. 9 is a schematic diagram of a switching circuit for a cross-point architecture magnetoresistive sensor configuration and an arrangement of row leads and column leads according to an embodiment of the present invention.

FIG. 9 is a schematic diagram of a switching circuit for a cross-point architecture magnetoresistive sensor configuration and an arrangement of row leads and column leads according to an embodiment of the present invention. The switching circuit is a part of a digital liquid level sensor based on a magnetoresistive sensor cross-point array. FIG. 9 illustrates a PCB board layout with 3×3 MTJ elements 16 configured in a cross-point architecture as a digital level sensor. Referring to FIG. 9, alternatively, the digital liquid level sensor based on a magnetoresistive sensor cross-point array also includes row selection MOSFET 44, column selection MOSFET 7, and comparison circuit 24, wherein the drain of row selection MOSFET 44 is electrically connected to a row lead, the gate of row selection MOSFET 7 is connected to an output end of the row decoder (not shown in the figure), and the source of row selection MOSFET 44 is connected in series to one end of first resistor R1 and a first input end of comparison circuit 24, and an electrical node between row selection MOSFET 44 and first resistor R1 is output as output voltage Vout, and the other end of first resistor R1 is connected to power voltage VCC; the column decoder (not shown in the figure) is electrically connected to the gate of column selection MOSFET 7; two second resistors R2 are connected in series between power voltage VCC and the ground, an intermediate point of the two second resistors R2 outputs reference voltage Vref and is connected to a second input end of comparison circuit 24, an output end Gout of the comparison circuit is electrically connected to the microcontroller (not shown in the figure), comparison circuit 24 outputs a high level signal value when output voltage Vout is smaller than reference voltage Vref, and outputs a low level signal value when output voltage Vout is greater than or equal to reference voltage Vref, wherein the output level signal values represent active values of the MTJ elements in the TMR sensor chips being addressed.

Figure 10:
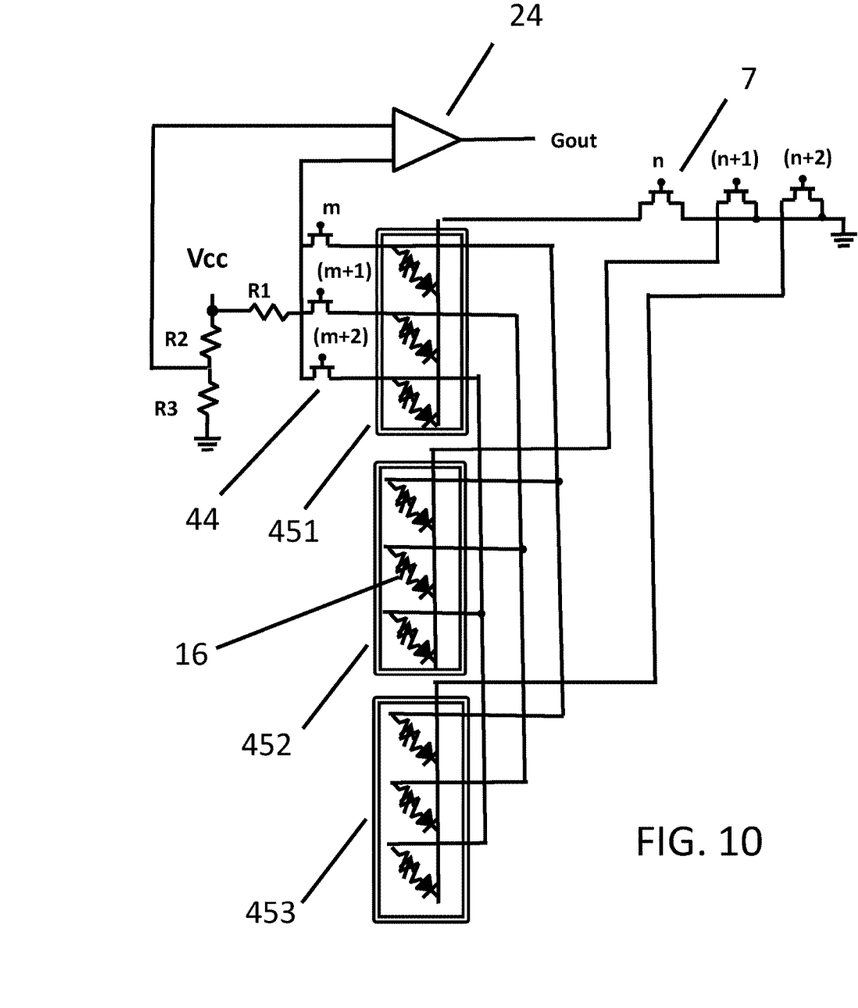
FIG. 10 is a schematic diagram of the linearization of a cross-point architecture magnetoresistive sensor along the long axis of a PCB board according to an embodiment of the present invention.

FIG. 10 is a schematic diagram of the linearization of a cross-point architecture magnetoresistive sensor along the long axis of a PCB board according to an embodiment of the present invention. As shown in FIG. 10, FIG. 10 describes how a cross-point architecture magnetoresistive sensor is linearized along the long axis direction of a strip PCB board, and shows the sensor wiring arrangement and respective switching circuits thereof. For example, 3×3 MTJ elements are shown in FIG. 10, in which every three MTJ elements forming a column belong to an element block. FIG. 10 illustrates the case of containing three element blocks 451, 452, 453, with each element block corresponding to a column lead, and the row corresponding to each element block being connected to the same row lead. One end of each MTJ element 16 in each element block is connected together, and the other end of MTJ element 16 is connected to the corresponding row lead, which is illustrated with the row leads being m, (m+1) and (m+2) respectively, and the column leads being n, (n+1), and (n+2) respectively in the figure as an example, wherein m≥1, and n≥1. The column leads are finally connected to the ground, and the row leads are connected to the VCC. The row leads are connected to the power supply VCC through reference resistor R1, to detect changes in the sensor resistance caused by an external magnetic field through the row leads. Another combination is also possible, that is, to detect changes in the sensor resistance by connecting the VCC to the column leads and connecting the row leads to the ground, and on the column leads connected to the VCC through reference resistor R1. The calculated sequential address values of the 3×3 scenario are as shown in Table 1 below:

TABLE 1

| Column address selection line 3, 4, 5 | | | | Row address selection line 12, 11, 10 | | | | Address Value Current row + total number of row's * (current column − 1) | Fill Level |
|---|---|---|---|---|---|---|---|---|---|
| n | n + 1 | n + 2 | Column | m | m + 1 | m + 2 | Row | | % |
| 0 | 0 | 0 | X | 0 | 0 | 0 | X | 0 | 0 |
| 1 | 0 | 0 | 1 | 1 | 0 | 0 | 1 | 1 | 11 |
| 1 | 0 | 0 | 1 | 0 | 1 | 0 | 2 | 2 | 22 |
| 1 | 0 | 0 | 1 | 0 | 0 | 1 | 3 | 3 | 33 |
| 0 | 1 | 0 | 2 | 1 | 0 | 0 | 1 | 4 | 44 |
| 0 | 1 | 0 | 2 | 0 | 1 | 0 | 2 | 5 | 56 |
| 0 | 1 | 0 | 2 | 0 | 0 | 1 | 3 | 6 | 67 |
| 0 | 0 | 1 | 3 | 1 | 0 | 0 | 1 | 7 | 78 |
| 0 | 0 | 1 | 3 | 0 | 1 | 0 | 2 | 8 | 89 |
| 0 | 0 | 1 | 3 | 0 | 0 | 1 | 3 | 9 | 100 |

The sequential address values in Table 1 are calculated using the sum of the current total number of rows and the total number of rows multiplied by the previous column number, represented as:

The TMR magnetic sensor chips are addressed by means of data decoded by the row decoder and the column decoder and on the basis of the equation Address=m+[M×(n−1)], wherein Address represents an address value, m represents the value of a current row with the range of $1 \leq m \leq M$, and n represents the value of a current column with the range of $1 \leq n \leq N$. The microcontroller scans addresses of TMR magnetic sensor chips 1 for the address of TMR magnetic sensor chip 1 in the highest active state, converts the address to a level value, and then transmits the level value to an output interface.

Then, the percentage of the liquid fill level corresponding to the address value may be calculated using the product of the address value divided by the product of the total number of rows and the total number of columns, which is represented as:

$$\text{Fill value} = \frac{100 * \text{Address value}}{(\text{Total Columns}) * (\text{Total Rows})}$$

wherein Fill Level represents the fill level, Address value represents the address value, Total Columns represents the total number of columns, and Total Rows represents the total number of rows.

The value of the fill level is linearly proportional to the sequential address values. When there is no sensor element being in the active state and the magnetic float is passing through a magnetic sensor, the liquid level sensor enters the default state of zero fill level.

In an actual design, the sensor element activated by selecting N column leads and M row leads should occupy the bottommost position of the PCB board, and the sensor element activated by selecting (n+2) and (m+2) should be located in the topmost position of the PCB board. The above is the case where a 3×3 array of MTJ elements is provided, and different arrays may be provided as needed in the present invention.

The digital liquid level sensor based on a magnetoresistive sensor cross-point array according to an embodiment of the present invention also includes a zero liquid level setting device, which sets the liquid level to the zero fill level state when there is no MTJ element being activated and the magnetic float passes through the sensor at the bottommost position.

Alternatively, the TMR sensor chips select a magnetoresistive sensor chip having two ports.

Alternatively, the magnetic field generated by the permanent magnet activates the MTJ elements at a distance greater than an interval between two MTJ elements but less than an interval between three MTJ elements, and a fill level value is calculated by inserting a permanent magnet between two MTJ elements. The relationship between an activated sensor and a fill level may be specifically found in Table 2. In this case, when two adjacent MTJ elements are activated, the microcontroller may insert a magnet whose height is equal to the height of the equidistant point between the two MTJ elements. When only one MTJ element is activated, the liquid level is speculated to be at the position of the single activated MTJ element. Table 2 below shows the number of row sensor elements and column sensor elements activated based on 3×3 MTJ elements, and the conversion relationship between the address value of the interpolation method and the fill percentage value.

TABLE 2

| Activated column sensor | | | Column | | | Activated row sensor | | | Row | | | Address Value 2*[RSA + (TotRows)*(CSA − 1) | Fill Level |
|---|---|---|---|---|---|---|---|---|---|---|---|---|---|
| n = 1 | n = 2 | n = 3 | Cols | ACT (n) | Sum CSA | m = 1 | m = 2 | m = 3 | Rows | Act (n) | Sum RSA | | % |
| 0 | 0 | 0 | 0 | X | 0 | 0 | 0 | 0 | 0 | X | N/A | N/A | N/A |
| 1 | 0 | 0 | 1 | 1 | 1 | 1 | 0 | 0 | 1 | 1 | — | — | — |
| 1 | 0 | 0 | 1 | 1 | 1 | 1 | 0 | 0 | 1 | 1 | 1 | 0 | 0.00 |
| 1 | 0 | 0 | 1 | 1 | 1 | 1 | 1 | 0 | 2 | 3 | 1.5 | 1 | 6.25 |
| 1 | 0 | 0 | 1 | 1 | 1 | 0 | 1 | 0 | 1 | 2 | 2 | 2 | 12.50 |

TABLE 2-continued

| Activated column sensor | | | Column | | | Activated row sensor | | | Row | | | Address Value | Fill Level |
|---|---|---|---|---|---|---|---|---|---|---|---|---|---|
| n = 1 | n = 2 | n = 3 | ACT Cols | Sum (n) | CSA | m = 1 | m = 2 | m = 3 | Act Rows | Sum (n) | RSA | 2*[RSA + (TotRows)*(CSA − 1) | % |
| 1 | 0 | 0 | 1 | 1 | 1 | 0 | 1 | 1 | 2 | 5 | 2.5 | 3 | 18.75 |
| 1 | 0 | 0 | 1 | 1 | 1 | 0 | 0 | 1 | 1 | 3 | 3 | 4 | 25.00 |
| 1 | 1 | 0 | 2 | 3 | 2 | 1 | 0 | 1 | 2 | 4 | 0.5 | 5 | 31.25 |
| 0 | 1 | 0 | 1 | 2 | 2 | 1 | 0 | 0 | 1 | 1 | 1 | 6 | 37.50 |
| 0 | 1 | 0 | 1 | 2 | 2 | 1 | 1 | 0 | 2 | 3 | 1.5 | 7 | 43.75 |
| 0 | 1 | 0 | 1 | 2 | 2 | 0 | 1 | 0 | 1 | 2 | 2 | 8 | 50.00 |
| 0 | 1 | 0 | 1 | 2 | 2 | 0 | 1 | 1 | 2 | 5 | 2.5 | 9 | 56.25 |
| 0 | 1 | 0 | 1 | 2 | 2 | 0 | 0 | 1 | 1 | 3 | 3 | 10 | 62.50 |
| 0 | 1 | 1 | 2 | 5 | 3 | 1 | 0 | 1 | 2 | 4 | 0.5 | 11 | 68.75 |
| 0 | 0 | 1 | 1 | 3 | 3 | 1 | 0 | 0 | 1 | 1 | 1 | 12 | 75.00 |
| 0 | 0 | 1 | 1 | 3 | 3 | 1 | 1 | 0 | 2 | 3 | 1.5 | 13 | 81.25 |
| 0 | 0 | 1 | 1 | 3 | 3 | 0 | 1 | 0 | 1 | 2 | 2 | 14 | 87.50 |
| 0 | 0 | 1 | 1 | 3 | 3 | 0 | 1 | 1 | 2 | 5 | 2.5 | 15 | 93.75 |
| 0 | 0 | 1 | 1 | 3 | 3 | 0 | 0 | 1 | 1 | 3 | 3 | 16 | 100.00 |
| 0 | 0 | 1 | 1 | 3 | 3 | 0 | 0 | 1 | 1 | 3 | — | — | — |

For the above case shown in Table 2, when a first element is activated by a floating magnet, the fill value starts from zero where the permanent magnet happens to be adjacent to a first sensor, and vice versa, and reaches 100% liquid fill in the case of the highest MTJ element. The address value is considered as invalid for the case where the float magnet is lower than the bottommost sensor element or the topmost sensor element.

The address value of Table 2 may be represented as:

Address value=2*[RSA+(Total Rows)*(CSA−1), wherein RSA may be calculated according to the following equation:

$$RSA = \frac{Sum(m) - \text{Total Columns} * (ACTCols - 1)}{ACTRows}$$

While CSA may be calculated according to the following equation:

$$CSA = Ceil\left[\frac{Sum(n)}{ACTCols}\right]$$

wherein the term Sum (m) is defined as the sum of running row sensors, Sum (n) is defined as the sum of running column sensors, ACTCols is defined as the number of activated column sensors, ACTRows is defined as the number of activated row sensors, and Ceil □ represents round by one.

To convert the above address value to a fill level percentage, calculate according to the following equation:

$$\text{Fill value} = \frac{100 * \text{Address value}}{2 * (\text{Total column} * \text{Total Rows} - 1)}$$

wherein Fill Level represents the fill level, Address value represents the address value, Total Columns represents the total number of columns, and Total Rows represents the total number of rows.

Alternatively, the TMR sensor chips are packaged with CSP.

All other embodiments obtained by a person of ordinary skill in the art based on the embodiments of the present invention without inventive effort shall fall within the scope of protection of the present invention. Although the present invention has been schematically described in the preferred embodiments, those skilled in the art will understand that various changes and modifications may be made to the present invention as long as they do not exceed the scope of the claims of the present invention.

The invention claimed is:

1. A digital liquid level sensor based on a magnetoresistive sensor cross-point array, comprising:
a printed circuit board (PCB), a plurality of tunnel magnetoresistance (TMR) magnetic sensor chips provided on the PCB, and M row leads and N column leads provided on the PCB, wherein M and N are integers greater than or equal to 1;
a microcontroller, a row decoder, and a column decoder provided on the PCB, wherein the microcontroller is electrically connected to the row decoder and the column decoder, the column decoder is connected to the TMR magnetic sensor chips through the column leads, the row decoder is connected to the TMR magnetic sensor chips through the row leads, each of the TMR magnetic sensor chips includes a plurality of magnetic tunnel junction (MTJ) elements, the MTJ elements are electrically connected into an MTJ element array of M rows and N columns, diodes are connected between each row of MTJ elements and a row lead or a column lead, and the TMR magnetic sensor chips are addressed by means of data decoded by the row decoder and the column decoder and on a basis of an equation Address=m+[M×(n−1)], in which Address represents an address value, m represents a value of a current row with a range of $1 \leq m \leq M$, and n represents a value of a current column with a range of $1 \leq n \leq N$;
the microcontroller is used for scanning addresses of the TMR magnetic sensor chips for the address of an MTJ element in a highest active state, converting the address value to a liquid level value in a linear proportional relationship therewith, and transmitting the liquid level value to an output interface;
a permanent magnet attached to a magnetic float that moves along a long axis direction of the PCB and changes a magnetic field state of an MTJ element near the permanent magnet, the magnetic float floating with a surface of a liquid in which the liquid level sensor is immersed; and a protective tube enclosing the PCB.

2. The digital liquid level sensor based on a magnetoresistive sensor cross-point array according to claim 1, wherein one end of each row of MTJ elements on each of the TMR magnetic sensor chips is electrically connected to one or more column lead pads connected to a column lead, and an other end of each row of MTJ elements is electrically connected to a row lead pad.

3. The digital liquid level sensor based on a magnetoresistive sensor cross-point array according to claim 2, wherein each row of MTJ elements includes an MTJ element or an MTJ element string containing at least two MTJ elements connected in series.

4. The digital liquid level sensor based on a magnetoresistive sensor cross-point array according to claim 3, wherein the diodes are integrated on the TMR magnetic sensor chips and connected in series between each row of MTJ elements and the row lead pad provided in the row.

5. The digital liquid level sensor based on a magnetoresistive sensor cross-point array according to claim 3, wherein the diodes are integrated on the TMR magnetic sensor chips and connected in series between each row of MTJ elements and the column lead pad electrically connected thereto.

6. The digital liquid level sensor based on a magnetoresistive sensor cross-point array according to claim 2, further comprising a row selection MOSFET, a column selection MOSFET, and a comparison circuit, wherein a drain of the row selection MOSFET is electrically connected to a row lead, a gate of the row selection MOSFET is connected to an output end of the row decoder, and a source of the row selection MOSFET is connected in series to one end of first resistor R1 and a first input end of the comparison circuit, and an electrical node between the row selection MOSFET and first resistor R1 is output as output voltage $V_{out}$, and the other end of first resistor R1 is connected to power voltage VCC; the column decoder is electrically connected to the gate of the column selection MOSFET; two second resistors R2 are connected in series between the power voltage VCC and a ground, an intermediate point of the two second resistors R2 outputs reference voltage $V_{ref}$ and is connected to a second input end of the comparison circuit, the output end of the comparison circuit is electrically connected to the microcontroller, the comparison circuit outputs a high level signal value when output voltage $V_{out}$ is smaller than reference voltage $V_{ref}$ and outputs a low level signal value when output voltage $V_{out}$ is greater than or equal to reference voltage $V_{ref}$, wherein the output level signal values represent active values of the MTJ elements in the TMR sensor chips being addressed.

7. The digital liquid level sensor based on a magnetoresistive sensor cross-point array according to claim 1, wherein the PCB is a flexible PCB.

8. The digital liquid level sensor based on a magnetoresistive sensor cross-point array according to claim 1, wherein the TMR magnetic sensor chips are connected to the PCB by means of lead bonding or chip flip and have a linear or bipolar response.

9. The digital liquid level sensor based on a magnetoresistive sensor cross-point array according to claim 1, further comprising a zero liquid level setting device which sets the liquid level to a zero fill level state when there is no MTJ element being activated and the magnetic float passes through the sensor at a bottommost position.

10. The digital liquid level sensor based on a magnetoresistive sensor cross-point array according to claim 1, wherein a magnetic field generated by the permanent magnet activates the MTJ elements at a distance greater than an interval between two MTJ elements but less than an interval between three MTJ elements, and a fill level value is calculated by inserting a permanent magnet between two MTJ elements.

11. The digital liquid level sensor based on a magnetoresistive sensor cross-point array according to claim 1, wherein the TMR sensor chips are packaged with chip scale package (CSP).

* * * * *